United States Patent
Ghodrat et al.

(10) Patent No.: US 11,996,166 B2
(45) Date of Patent: May 28, 2024

(54) ADAPTABLE ALLOCATION OF SRAM BASED ON POWER

(71) Applicant: Advanced Micro Devices, Inc., Santa Clara, CA (US)

(72) Inventors: Fataneh Ghodrat, Boxborough, MA (US); Tien E. Wei, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/556,139

(22) Filed: Aug. 29, 2019

(65) Prior Publication Data

US 2021/0065758 A1 Mar. 4, 2021

(51) Int. Cl.
| | |
|---|---|
| *G06F 12/00* | (2006.01) |
| *G06F 9/38* | (2018.01) |
| *G06F 12/02* | (2006.01) |
| *G11C 8/12* | (2006.01) |
| *G11C 11/4074* | (2006.01) |

(52) U.S. Cl.
CPC ............ *G11C 8/12* (2013.01); *G06F 9/3804* (2013.01); *G06F 12/0246* (2013.01); *G11C 11/4074* (2013.01); *G06F 2212/1028* (2013.01)

(58) Field of Classification Search
CPC ..... G06F 9/3804; G06F 12/0246; G11C 8/12; G11C 22/4074
USPC ....................................................... 711/154
See application file for complete search history.

(56) References Cited

U.S. PATENT DOCUMENTS

| | | | | |
|---|---|---|---|---|
| 5,819,308 | A * | 10/1998 | Tien | G06F 9/3836 |
| | | | | 711/108 |
| 8,171,239 | B2 | 5/2012 | Yim et al. | |
| 8,601,234 | B2 * | 12/2013 | Plondke | G06F 12/1027 |
| | | | | 711/205 |
| 9,038,073 | B2 * | 5/2015 | Kohlenz | G06F 9/5044 |
| | | | | 712/3 |
| 9,819,258 | B1 * | 11/2017 | Vandam | G01R 31/31816 |
| 2006/0059314 | A1 | 3/2006 | Bouchard et al. | |
| 2008/0320203 | A1 * | 12/2008 | Fitzgerald | G06F 12/0292 |
| | | | | 711/E12.082 |
| 2009/0031120 | A1 * | 1/2009 | Vaden | G06F 9/3836 |
| | | | | 712/E9.032 |
| 2009/0259799 | A1 * | 10/2009 | Wong | G06F 12/0246 |
| | | | | 711/E12.008 |
| 2010/0070695 | A1 * | 3/2010 | Baek | G06F 12/023 |
| | | | | 711/E12.001 |
| 2010/0100682 | A1 * | 4/2010 | Guthrie | G06F 12/0897 |
| | | | | 711/E12.024 |
| 2010/0250980 | A1 * | 9/2010 | Wang | G06F 1/3225 |
| | | | | 711/E12.001 |
| 2011/0194606 | A1 * | 8/2011 | Hsieh | H04N 19/423 |
| | | | | 375/E7.123 |
| 2012/0089781 | A1 * | 4/2012 | Ranade | G06F 16/183 |
| | | | | 711/E12.001 |

(Continued)

*Primary Examiner* — Mohamed M Gebril
(74) *Attorney, Agent, or Firm* — Volpe Koenig

(57) ABSTRACT

A technique for processing computer instructions is provided. The technique includes obtaining information for an instruction state memory entry for an instruction; identifying, for the instruction state memory entry, a slot in an instruction state memory having selectably powered rows and blocks, based on clustering criteria; and placing the instruction state memory entry into the identified slot.

20 Claims, 6 Drawing Sheets

(56) References Cited

U.S. PATENT DOCUMENTS

| | | | |
|---|---|---|---|
| 2012/0254573 A1* | 10/2012 | Jacob et al. | G06T 1/60 711/E12.001 |
| 2014/0029341 A1* | 1/2014 | In | G11C 11/5628 365/185.12 |
| 2014/0136873 A1 | 5/2014 | Beternitz et al. | |
| 2014/0156950 A1* | 6/2014 | Chew | G06F 12/0831 711/146 |
| 2016/0202993 A1* | 7/2016 | Eisen | G06F 9/30141 712/215 |
| 2016/0342521 A1* | 11/2016 | Richmond | G06F 12/0884 |
| 2018/0024752 A1* | 1/2018 | Miller | H04L 47/83 |
| 2018/0081802 A1* | 3/2018 | Luo | G06F 13/1694 |
| 2018/0260014 A1* | 9/2018 | Parris | G06F 1/3275 |
| 2019/0103143 A1* | 4/2019 | Hasbun | G11C 11/221 |
| 2019/0163394 A1* | 5/2019 | Loh | G06F 12/0888 |
| 2020/0020361 A1* | 1/2020 | Jain | G11C 11/417 |
| 2020/0159812 A1* | 5/2020 | Zarar | G06F 17/16 |
| 2020/0257627 A1* | 8/2020 | Chamarty | G06F 1/3275 |
| 2021/0034610 A1* | 2/2021 | Arora | G06F 16/22 |
| 2021/0065758 A1* | 3/2021 | Ghodrat | G06F 1/3225 |

* cited by examiner ly, 166 B2

ADAPTABLE ALLOCATION OF SRAM BASED ON POWER

BACKGROUND

In computer systems, volatile memory such as static random access memory consumes power when powered on. Techniques for improving power consumption of volatile memory are constantly being developed.

BRIEF DESCRIPTION OF THE DRAWINGS

A more detailed understanding can be had from the following description, given by way of example in conjunction with the accompanying drawings wherein.

DETAILED DESCRIPTION

A technique for processing computer instructions is provided. The technique includes obtaining information for an instruction state memory entry for an instruction; identifying, for the instruction state memory entry, a slot in an instruction state memory having selectably powered rows and blocks, based on clustering criteria; and placing the instruction state memory entry into the identified slot.

Figure 1:
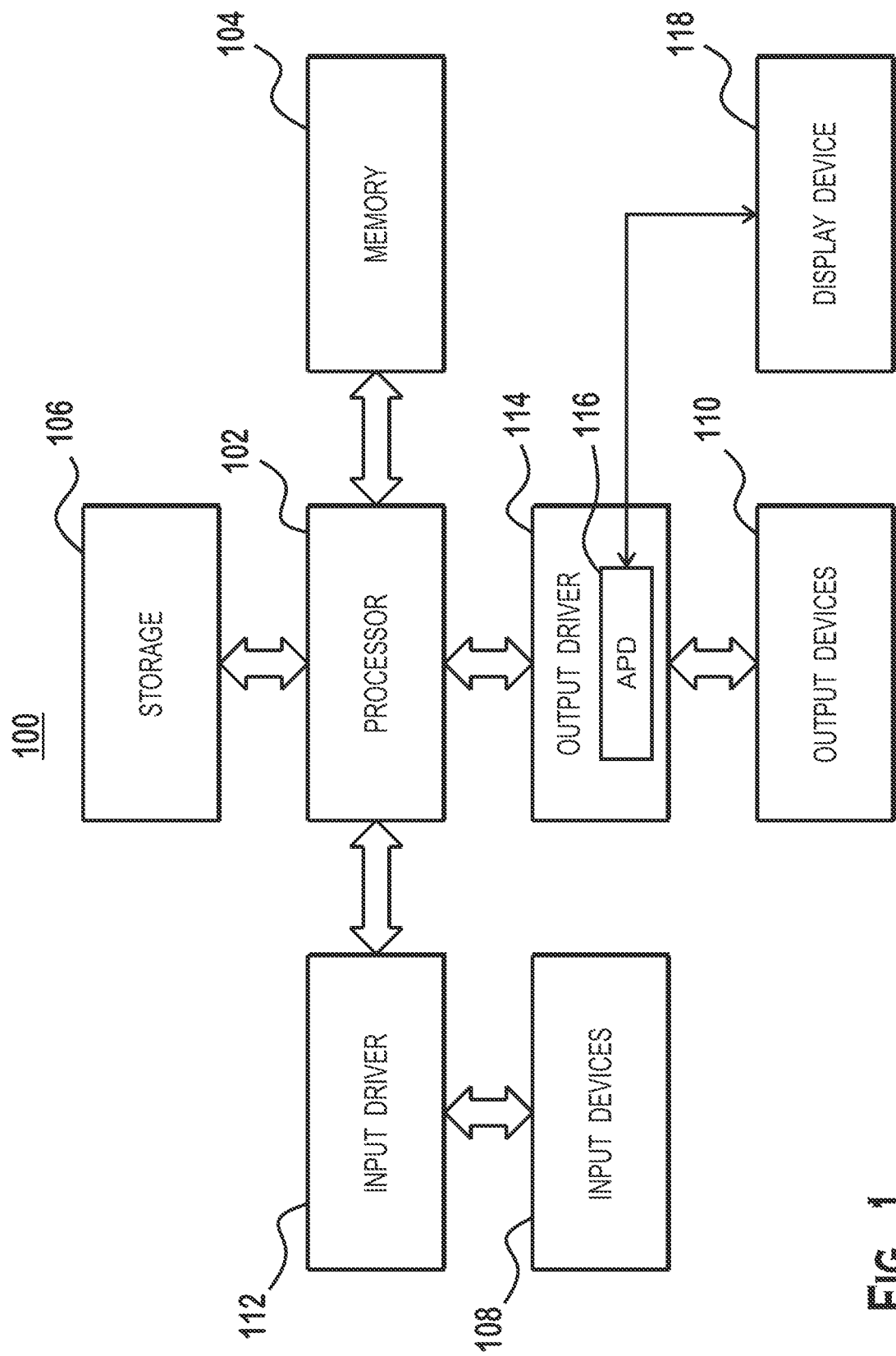
FIG. 1 is a block diagram of an example device in which one or more features of the disclosure can be implemented.

FIG. 1 is a block diagram of an example device 100 in which one or more features of the disclosure can be implemented. The device 100 could be one of, but is not limited to, for example, a computer, a gaming device, a handheld device, a set-top box, a television, a mobile phone, a tablet computer, or other computing device. The device 100 includes a processor 102, a memory 104, a storage 106, one or more input devices 108, and one or more output devices 110. The device 100 also includes one or more input drivers 112 and one or more output drivers 114. Any of the input drivers 112 are embodied as hardware, a combination of hardware and software, or software, and serve the purpose of controlling input devices 112 (e.g., controlling operation, receiving inputs from, and providing data to input drivers 112). Similarly, any of the output drivers 114 are embodied as hardware, a combination of hardware and software, or software, and serve the purpose of controlling output devices 114 (e.g., controlling operation, receiving inputs from, and providing data to output drivers 114). It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU. In various alternatives, the memory 104 is located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, without limitation, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 and output driver 114 include one or more hardware, software, and/or firmware components that are configured to interface with and drive input devices 108 and output devices 110, respectively. The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. The output driver 114 includes an accelerated processing device ("APD") 116 which is coupled to a display device 118, which, in some examples, is a physical display device or a simulated device that uses a remote display protocol to show output. The APD 116 is configured to accept compute commands and graphics rendering commands from processor 102, to process those compute and graphics rendering commands, and to provide pixel output to display device 118 for display. As described in further detail below, the APD 116 includes one or more parallel processing units configured to perform computations in accordance with a single-instruction-multiple-data ("SIMD") paradigm. Thus, although various functionality is described herein as being performed by or in conjunction with the APD 116, in various alternatives, the functionality described as being performed by the APD 116 is additionally or alternatively performed by other computing devices having similar capabilities that are not driven by a host processor (e.g., processor 102) and configured to provide graphical output to a display device 118. For example, it is contemplated that any processing system that performs processing tasks in accordance with a SIMD paradigm may be configured to perform the functionality described herein. Alternatively, it is contemplated that computing systems that do not perform processing tasks in accordance with a SIMD paradigm performs the functionality described herein.

Figure 2:
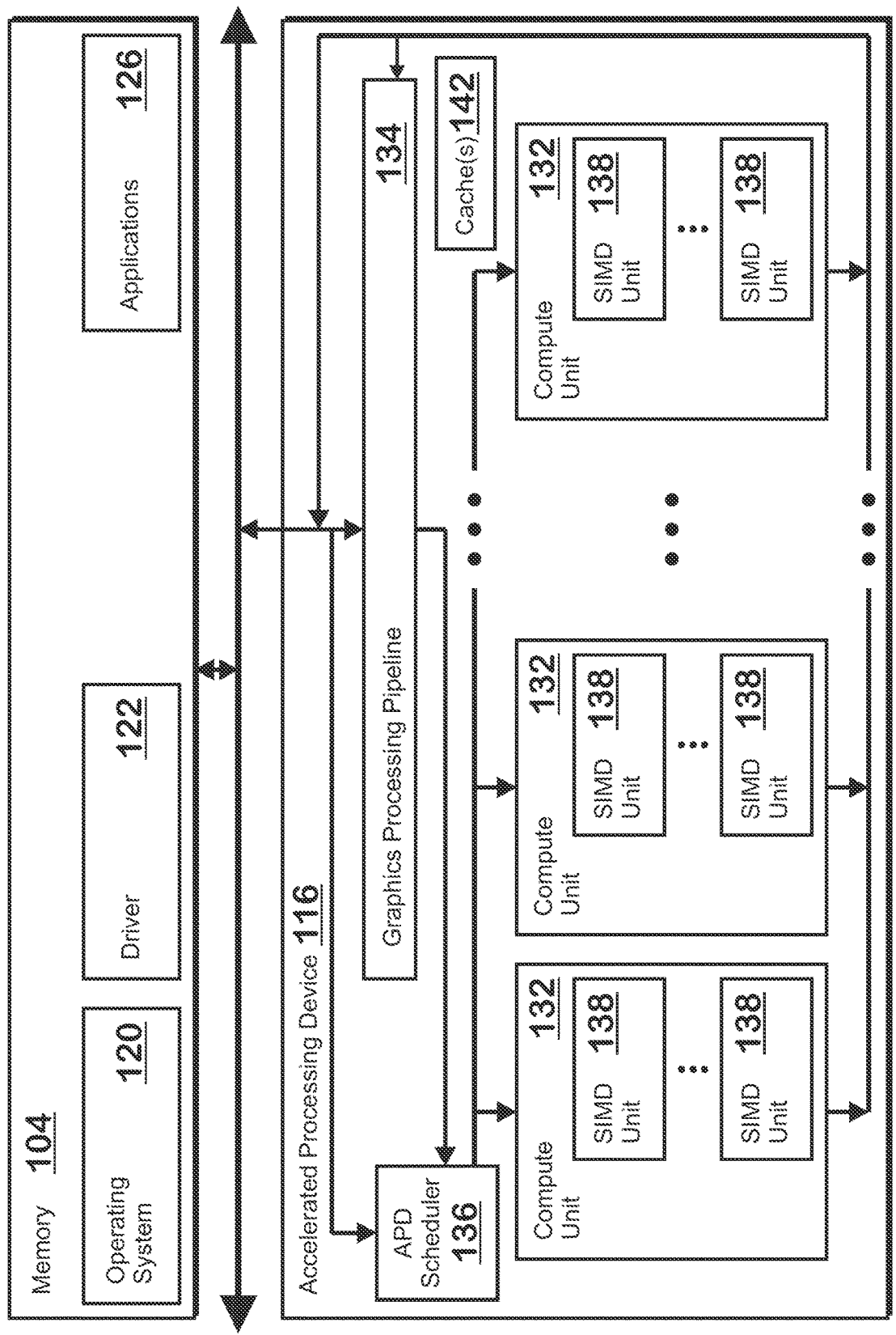
FIG. 2 illustrates details of the device of FIG. 1, according to an example.

FIG. 2 illustrates details of the device 100 and the APD 116, according to an example. The processor 102 (FIG. 1) executes an operating system 120, a driver 122, and applications 126, and may also execute other software alternatively or additionally. The operating system 120 controls various aspects of the device 100, such as managing hardware resources, processing service requests, scheduling and controlling process execution, and performing other operations. The APD driver 122 controls operation of the APD 116, sending tasks such as graphics rendering tasks or other work to the APD 116 for processing. In some implementations, the APD driver 122 also includes a just-in-time compiler that compiles programs for execution by processing components (such as the SIMD units 138 discussed in further detail below) of the APD 116.

The APD 116 executes commands and programs for selected functions, such as graphics operations and non-graphics operations that may be suited for parallel processing. The APD 116 can be used for executing graphics pipeline operations such as pixel operations, geometric computations, and rendering an image to display device 118 based on commands received from the processor 102. The APD 116 also executes compute processing operations that are not directly related to graphics operations, such as operations related to video, physics simulations, computational fluid dynamics, or other tasks, based on commands received from the processor 102.

The APD 116 includes compute units 132 that include one or more SIMD units 138 that are configured to perform operations at the request of the processor 102 (or another unit) in a parallel manner according to a SIMD paradigm. The SIMD paradigm is one in which multiple processing elements share a single program control flow unit and program counter and thus execute the same program but are able to execute that program with different data. In one example, each SIMD unit 138 includes sixteen lanes, where each lane executes the same instruction at the same time as the other lanes in the SIMD unit 138 but can execute that instruction with different data. Lanes can be switched off with predication if not all lanes need to execute a given instruction. Predication can also be used to execute programs with divergent control flow. More specifically, for programs with conditional branches or other instructions where control flow is based on calculations performed by an individual lane, predication of lanes corresponding to control flow paths not currently being executed, and serial execution of different control flow paths allows for arbitrary control flow.

The APD 116 includes one or more caches 142 that are accessible to the compute units 132. The caches 142 implement a cache coherent protocol to allow data stored in any individual cache 142 to be accessible to any of the compute units 132.

The parallelism afforded by the compute units 132 is suitable for graphics related operations such as pixel value calculations, vertex transformations, and other graphics operations. Thus in some instances, a graphics pipeline 134, which accepts graphics processing commands from the processor 102 (or another entity), provides computation tasks to the compute units 132 for execution in parallel.

The compute units 132 are also used to perform computation tasks not related to graphics or not performed as part of the "normal" operation of a graphics pipeline 134 (e.g., custom operations performed to supplement processing performed for operation of the graphics pipeline 134). An application 126 or other software executing on the processor 102 transmits programs ("kernels") that define such computation tasks to the APD 116 for execution.

The basic unit of execution in compute units 132 is a work-item. Each work-item represents a single instantiation of a program (also sometimes referred to as a "kernel") that is to be executed in parallel in a particular lane. Work-items can be executed simultaneously (or partially simultaneously and partially sequentially) as a "wavefront" on a single SIMD processing unit 138. One or more wavefronts are included in a "workgroup," which includes a collection of work-items designated to execute the same program. A workgroup can be executed by executing each of the wavefronts that make up the work group. In alternatives, wavefronts are executed on a single SIMD unit 138 or on different SIMD units 138. An APD scheduler 136 is configured to perform operations related to scheduling various workgroups and wavefronts on compute units 132 and SIMD units 138. In an example of usage, an application 126 indicates to the APD 116 the manner in which to execute a kernel, in terms of the "size" of an execution of the kernel, where "size" indicates the number of work-items. In some modes of operation, the application 126 also specifies how work-items are divided into workgroups. In other modes of operation, the APD 116 and/or driver 122 determines how to divide the work-items into workgroups. The size of the execution of the kernel, and the number of work-items to be executed per workgroup, determines how many workgroups are to be executed for a given kernel execution. These workgroups are executed by the APD 116. The APD scheduler 136 assigns the workgroups to a compute unit 132 for execution based on the availability of computing resources (e.g., how many workgroups are assigned to a particular compute unit 132, and whether other resources, such as memory, registers, or other resources are available).

Figure 3:
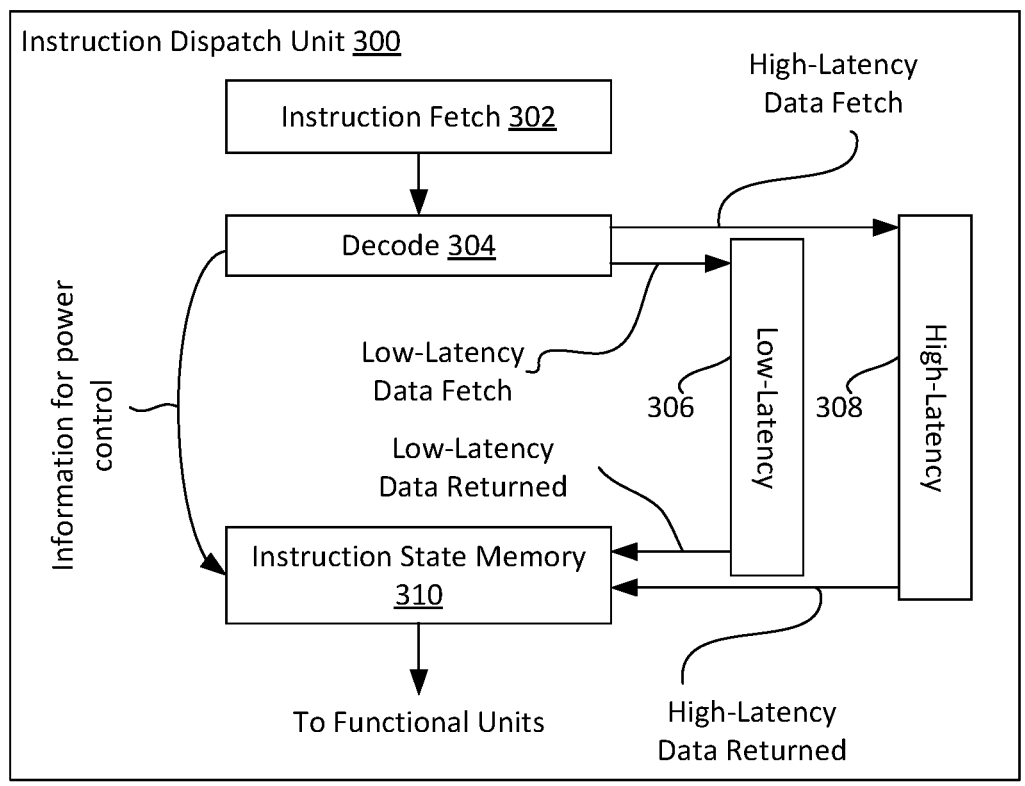
FIG. 3 is a block diagram of an instruction dispatch unit, according to an example.

FIG. 3 is a block diagram of an instruction dispatch unit 300, according to an example. The instruction dispatch unit 300 is included in a processor, such as the SIMD unit 138, the processor 102, or another processor not described in this description.

The instruction dispatch unit 300 includes an instruction fetch block 302, a decode block 304, and an instruction state memory 310. The instruction dispatch unit 300 also includes a low-latency block 306 and a high-latency block 308. The low-latency block provides low-latency data to the instruction state memory 310 at the request of the decode unit 304. Low-latency data is data necessary for the execution of an instruction whose latency to be fetched is lower than the latency to be fetched of high-latency data. The high-latency block provides high-latency data to the instruction state memory 310 at the request of the decode unit 304. In general, low-latency data is data that can be retrieved from structures that are close to the decode unit 304 in terms of signal propagation latency. One example of such structures include custom calculation circuitry that receives operations to calculate specific values from the decode unit 304, calculates those values, and provides those values to the instruction state memory 310. Another example of low-latency structures includes memories that are "close" to the decode unit 304 and instruction state memory 310, such that the access latency to those memories is lower than the fastest access latency for any memory of the high-latency data unit 308. The low-latency data block 306 comprises the collection of any structure—including processing circuits, low-latency memory, or the like, that provides such low-latency data. High-latency data is data that is retrieved from structures with a longer latency than the longest latency of the low-latency data unit 306. Examples of high-latency data structures include a cache (including a lowest-level cache such as a level-0 cache), system memory, non-volatile storage, or other structures. The high-latency data block 308 includes all such structures, or, where such structures are physically external to the instruction dispatch unit 300, the interface (i.e., the hardware circuit that sends requests for high-latency data and receives the high-latency data in response) within the instruction dispatch unit 300 to such structures.

In operation, the instruction fetch unit 302 fetches instructions to be executed and provides those instructions to the decode unit 304. The decode unit 304 analyzes the instructions to generate micro-operations for performance by functional units, which are not shown in detail. Functional units are any of a variety of units that perform processing for instructions, such as arithmetic logic units ("ALUs"), load/ store units that read from or write to memory, or other units. Virtually all processors that execute programs composed from instructions selected from an instruction set architecture have decode units and functional units.

Instructions to be executed consume either or both of low-latency data and high-latency data. Various processors have instruction sets that include some instructions that consume low-latency data but not high-latency data, some instructions that consume high-latency data but not low-latency data, some instructions that consume high-latency data and low-latency data, and some instructions that consume neither high-latency data nor low-latency data.

After the decode unit 304 decodes the instruction, if the instruction requires low-latency data, the decode unit 304 fetches the low-latency data from low-latency data block 306. Once the low-latency data is obtained, the decode unit 304 places an entry including the micro-operations for the instruction and the low-latency data in the instruction state memory 310. The decode unit 304 also triggers fetching of the high-latency data from the high-latency data block 308. When the high-latency data is retrieved from the high-latency data block 308, the instruction is ready for execution and the instruction state memory 310 sends the instruction to the functional units. It is possible for a single instruction set architecture instruction to result in multiple entries in the instruction state memory 310. In other words, it is possible for the decode unit 304 to generate multiple micro-operations for each instruction set architecture instruction and to generate an entry in the instruction state memory 310 for each micro-operation.

In addition to sending the micro-operations and the low-latency data, if any, to the instruction state memory 310, the decode unit 304 sends information for power control to the instruction state memory 310. The instruction state memory 310 includes a plurality of individually-powerable blocks that power on and off depending on the contents of the instruction state memory 310 and on the power control information received from the decode unit 304.

Figure 4:
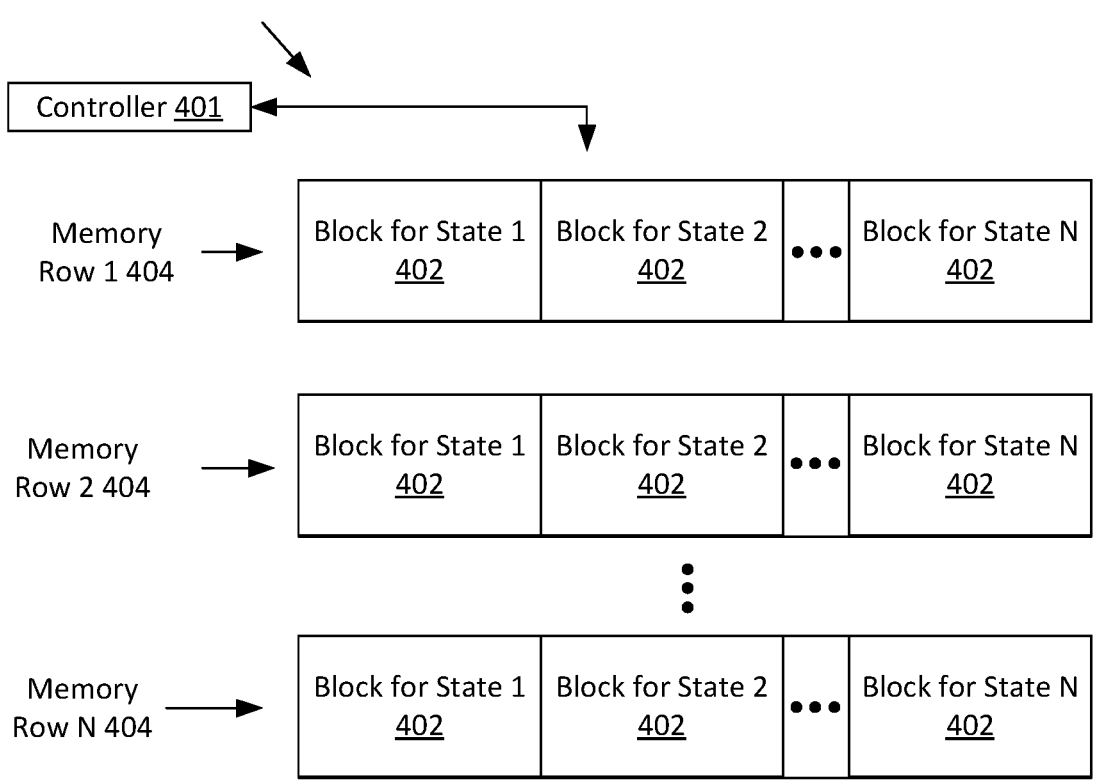
FIG. 4 is a block diagram of an instruction state memory, according to an example.

FIG. 4 is a detailed block diagram of the instruction state memory 310, according to an example. The instruction state memory 310 includes a plurality of blocks 402 organized in a plurality of rows 404. Each row 404 includes one or more entries. Within a row 404, each block 402 stores a different type data than other blocks 402. Specifically, a block 402 stores either "core instruction state"—which is data that identifies the micro-operation that the entry is for, or a certain type of low-latency data. Each block 402 may be powered on or off separately from each other block. The term "powering on or off" refers collectively to either performing clock gating (pausing or resuming the clock to retain the data in the memory elements but preventing reading or writing) or power gating (switching on or of the power to the block 402). Each row 404 may also be individually powered on or off. A controller 401 powers on and off the rows in response to the contents of the memory 400, whether entries are being placed into or removed from specific rows 404, and in response to the information for power control received from the decode unit 204.

In FIG. 4, the blocks 402 in the same position in each row store the same type of data. In the example, the blocks for state 1 402 all store the same type of data, the blocks for state 2 402 all store the same type of data, and so on. Particular instructions may require any subset of the types of data that can be stored in a row 404. More specifically, one type of instruction may require data that would be stored in the block for state 1, and data that would be stored in the block for state 3, but not data that would be stored in other blocks such as the block for state 2. Thus the entry in the instruction state memory 310 for that instruction would store data in the block for state 1 and the block for state 2 but not in any other block.

In some situations, the controller 401 powers off a block 402 in a row 404 if no entries in that row store data of the type of that block. In some implementations, after detecting that the last entry in a row 404 that uses data for a particular block 402 has been deleted from the row 404, the controller immediately powers down that block 402. In some implementations, after detecting that the last entry in a row 404 that uses data for a particular block 402 has been deleted from the row 404, the controller enters a waiting period. If, during the waiting period, the controller 401 determines that another entry is to be placed in the row 404 that uses data associated with the block 402, then the controller 401 does not power down the block 402. If, during the waiting period, the controller 401 determines that no entry is to be placed into the row 404 that uses data associated with the block 402, then the controller 401 powers down the block 402.

The waiting period for block 402 power down can be determined in any technically feasible manner. The waiting period may be constant regardless of the state of the instruction state memory 310 or may vary depending on the state of the instruction state memory 310 and/or the state of instructions being decoded by the decode unit 304. In some implementations, the waiting period for block 402 power down is based on a comparison between the power consumed by leaving the block 402 powered on during an idle period and the power saved by turning the block 402 off and then on again during the idle period. The idle period is the number of cycles between when the block 402 becomes empty and when a new entry is placed into the block 402. In some examples, the idle period is known from the state of the instruction dispatch unit 300. Specifically, when the block 402 becomes empty, if there is an instruction being processed in the instruction dispatch unit 300 for which an entry using the block 402 has not yet been generated in the instruction state memory 310 (e.g., low-latency data is being fetched), but it is known that the instruction will require an entry in block 402 in a certain number of cycles after the block 402 becomes empty, then the certain number of cycles is the duration of the idle period. If there is no instruction in the instruction dispatch unit 300, then the idle period is a default idle period, which, in some embodiments, is the smallest number of cycles from when the instruction dispatch unit receives an instruction that will need space in the block 402 to when that instruction is to actually occupy that block 402. In some implementations, the amount of power consumed by leaving the block 402 on in the idle period versus powering the block 402 off and then on during the idle period is predetermined by a designer. In that situation, the instruction state memory 310 is configured to be powered off and then on again if the idle period is above a threshold and is configured to remain powered on if the idle period is less than or equal to the threshold, where the threshold is the crossover point where it becomes more power-expensive to leave the block 402 on instead of powering the block 402 off and then powering the block 402 on. In some examples, the threshold is programmable, for example, via a configuration register.

In some situations, the controller 401 powers off a row 404 if the row stores no entries. In some implementations, after detecting that the last entry in a row 404 has been deleted from the row 404, the controller immediately powers down that row 404. In some implementations, after detecting that the last entry in a row 404 has been deleted from the row 404, the controller enters a waiting period. If, during the waiting period, the controller 401 determines that another entry is to be placed in the row 404, then the controller 401 does not power down the row 404. If, during the waiting period, the controller determines that no other entry is to be placed into the row 404, then the controller 401 powers down the row 404.

The waiting period for row 404 power down can be determined in any technically feasible manner. The waiting period may be constant regardless of the state of the instruction state memory 310 or may vary depending on the state of the instruction state memory 310 and/or the state of instructions being decoded by the decode unit 304. In some implementations, the waiting period for row 404 power down is based on the number of rows 404 that are powered on. Specifically, the more rows that are powered on, the shorter the delay 404. In some implementations, the waiting period for row 404 power-down is based on the number of freed entries in other rows 404 that are powered on. The more freed entries there are in other rows 404 that are powered on, the shorter the delay. In some implementations, the waiting period is based on how many entries are required for in-flight instructions. In some implementations, the instruction state memory 310 determines how to power down a row 404 in a similar manner as with the above description regarding whether to power down a block 402, with the term "row 404" substituted for the term "block 402."

Figure 5:
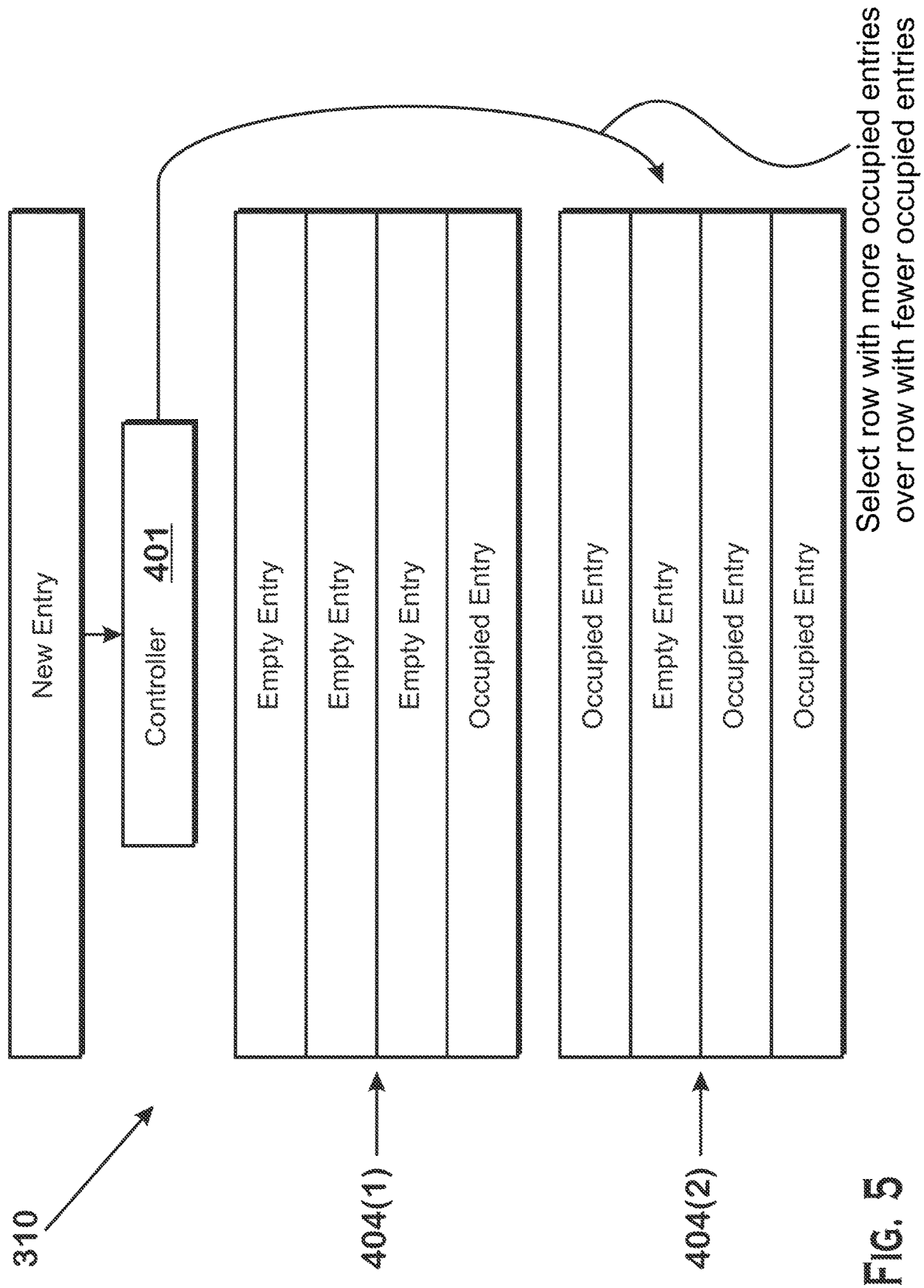
FIG. 5 is a diagram illustrating an entry insertion operation for an instruction state memory, according to an example.

FIG. 5 illustrates an operation for placing a new entry into the instruction state memory 310, according to an example. The controller 401 attempts to cluster entries together in rows 404, in order to maximize the number of rows 404 that can be turned off. Specifically, when the controller 401 receives a new entry to place into the instruction state memory 310, the controller 401 determines the row 404 having the fewest empty entry slots, while still having at least one empty entry slot, and places the new entry in one of the empty entry slots in the identified row 404. In an example, if two rows 404 have the same number of empty entries, the controller 401 selects the row 404 with the youngest entry. Selecting the row 404 with the smallest number of empty entry slots to receive a new entry results in a lower number of total rows 404 being active, which allows a greater number of rows 404 to be powered down.

In some situations, upon determining that a new entry requires a particular type of low latency data, and thus would require that a particular block 402 would need to be powered on in the row 404 that the entry is placed in, the controller 401 selects a row 404 with that block 402 already powered on instead of a row 404 with that block 402 powered off. In some implementations, if two rows 404 have the same number of empty entries, but one has a block 402 needed by a new entry powered on and one does not have that block 402 powered on, then the controller 401 selects the row 404 with the needed block 402 powered on. In some implementations, the controller 401 selects the row 404 that has the needed block 402 powered on even if that row 404 has more empty entries than another row 404, as long as the selected row 404 is the row 404 with the lowest number of empty entries that also has the needed block 402 powered on. In some implementations, the controller 401 selects a row 404 that has the needed block 402 powered on if that row has more empty entries than another row 404 with the needed block 402 powered off as long as the number of empty entries in the row 404 to be selected is within a threshold number or threshold percent of the number of empty entries in the row 404 with the needed block 402 powered off.

Figure 6:
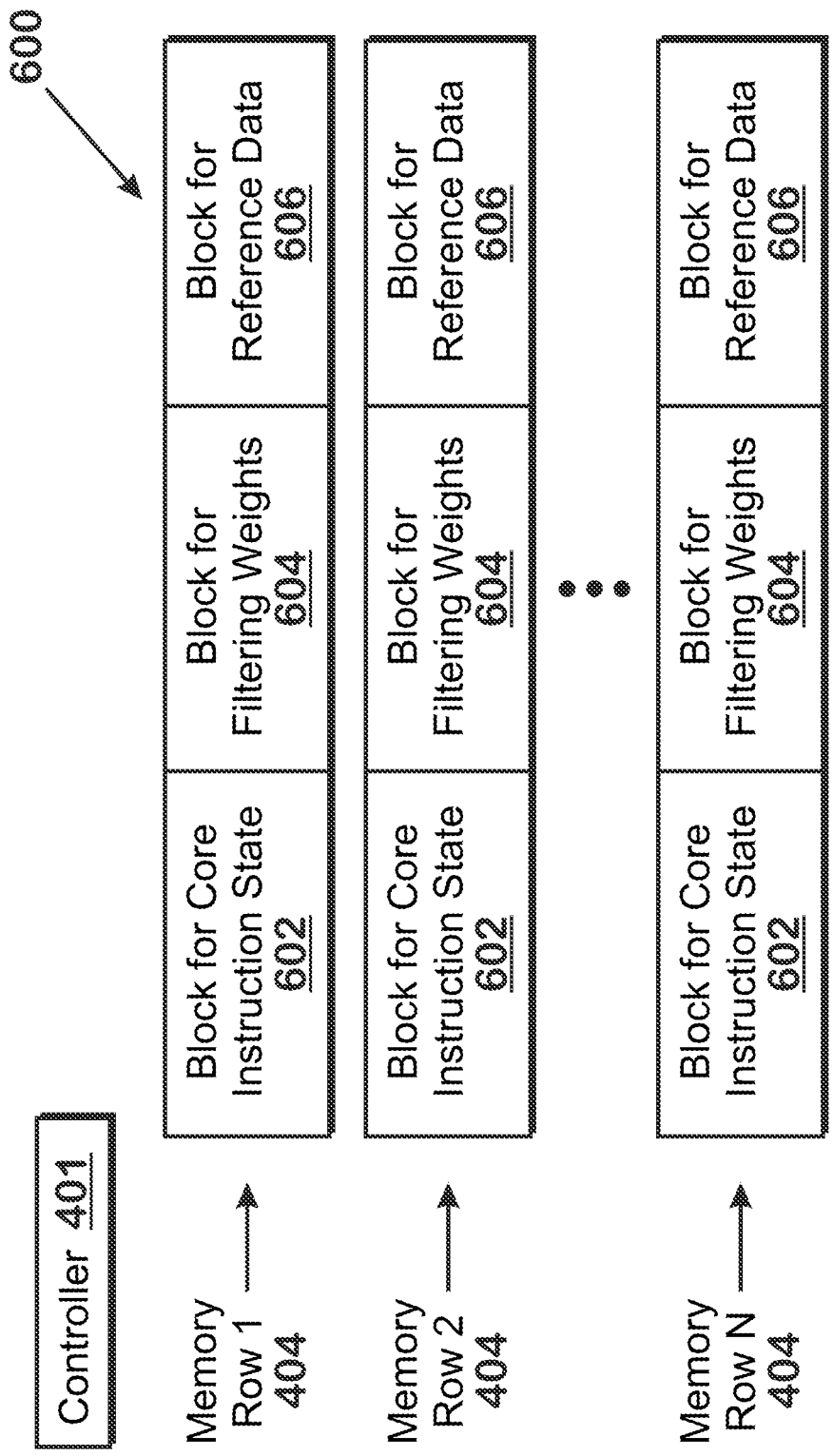
FIG. 6 is a block diagram of an example implementation of an instruction state memory.

FIG. 6 is a block diagram of an example implementation of the instruction state memory 310, a SIMD unit instruction state memory 600. The SIMD unit instruction state memory 600 includes blocks for core instruction state 602, blocks for filtering weights 604, and blocks for reference data 606.

As stated above, the SIMD units 138 execute shader programs that include sequences of instructions. An instruction dispatch unit 300, which includes the instruction state memory 310, fetches and decodes instructions and places decoded instructions and state data into the instruction state memory 310.

The core instruction state is information identifying the operations that need to be performed for the instruction to be executed. In an example, the instruction is an add instruction and the core instruction state indicates that add operations need to be performed. The block for filtering weights 604 stores filtering weights for texture instructions. More specifically, some instructions require manipulation of texture data, with application of a filter. The filter may include weights that are determined based on the instruction identity, and these weights may be applied to operands such as texels. In this example, the filter weights are low latency data and the texels are high-latency data. The filter weights would be placed into a block for filtering weights 604 in response to be retrieved from the low-latency data block 306.

The block for reference data 606 stores reference data to be used by an instruction. The reference data is data to be compared with another value, such as an item of high-latency data. In an example, the block for reference data 606 stores depth values for a pixel used for z-testing (which is also sometimes called depth-testing). In some examples, a pixel shader program performs depth testing against values stored in the depth buffer. Specifically, the pixel shader compares depth values of pixels being processed with values in the depth buffer and may discard the pixels and/or modify the depth buffer as a result. The reference data is the depth value for the pixel and the operand is the value retrieved from the depth buffer.

An instruction typically uses the block for core instruction state 602. Thus, in some implementations, when a row 404 is powered on, the block for core instruction state 602 is not powered off. An instruction may use either or both of the block for filtering weights 604 or the block for reference data 606 depending on the identity of the instruction. Thus, when an instruction is in a particular row 404, the blocks for the low-latency data used by that instruction are switched on. In various implementations, when the controller 401 determines that an instruction that uses either or both of filtering weights or reference data is to be placed into a row 404 with those blocks powered off, the controller 401 causes those blocks to be powered on.

Figure 7:
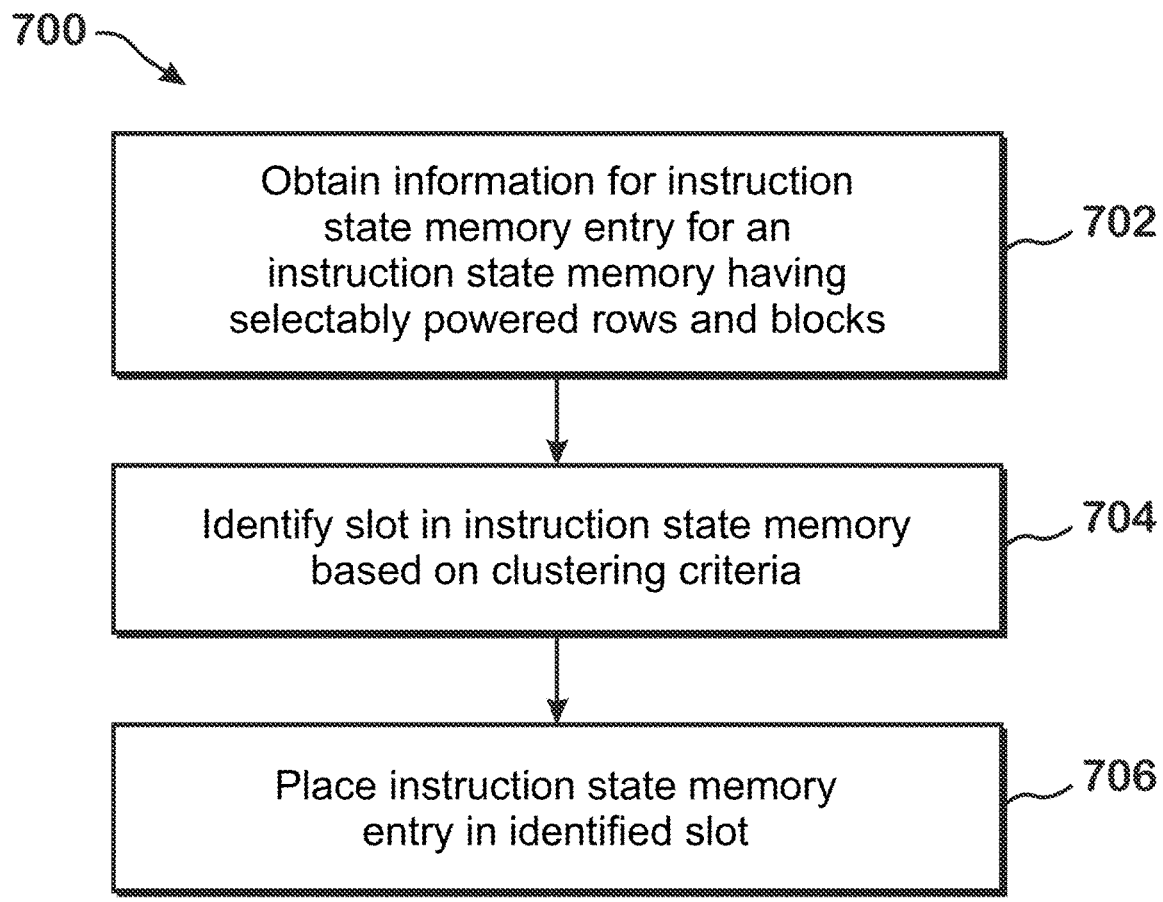
FIG. 7 is a flow diagram of a method for placing entries into an instruction state memory, according to an example.

FIG. 7 is a flow diagram of a method 700 for placing entries into an instruction state memory 310, according to an example. Although described with respect to the system of FIGS. 1-6, those of skill in the art will understand that any system, configured to perform the steps of method 700 in any technically feasible order, falls within the scope of the present disclosure.

The method 700 begins at step 702, where the controller 401 of the instruction state memory 310 receives information for an instruction state memory entry for an instruction. This information is received from the decoder 304 and indicates which type of low-latency data is used by the instruction associated with the instruction state memory entry. If the instruction requires low-latency data to be fetched, then the decoder 304 requests that information from the low-latency data block 306. The decoder 304 also requests high-latency data from the high-latency data block 308. Note that the decoder 304 may expand an instruction into multiple micro-operations, and that each micro-operation may require an instruction state memory entry. In this case, aspects of method 700 (such as steps 704 and 706), or all of method 700, would be repeated for each micro-operation generated from an instruction. In some implementations, the clustering criteria considers the total number of slots needed for an instruction, instead of just one slot.

At step 704, the controller 401 identifies a slot in the instruction state memory 310 based on clustering criteria. The clustering criteria exist to cause more entries to be clustered in fewer rows 404, to allow for more rows 404 to be powered off. In some implementations, the clustering criteria also cause entries to be clustered in rows 404 that have the same blocks 402 powered on and the same blocks 402 powered off.

In some implementations, the clustering criteria are as follows. The controller 401 attempts to place a new entry into a row 404 with the lowest, non-zero number of empty entries. This action results in a concentration of entries in rows 404.

In some implementations, the clustering criteria also take into account the blocks 402 that are powered on in used rows 404. In one example, if there are multiple rows 404 that have the have smallest number of entries (i.e., if two or more rows 404 have same number of empty entries that is also the smallest number of empty entries) then the controller 401 selects the row 404 that would result in the smallest number of blocks 402 being powered on. For example, if a new entry for an instruction requires low latency data for block 2, and if one row 404 with the smallest number of entries has block 2 powered on and one row 404 with the smallest number of entries has block 2 powered off, then the controller 401 selects the row 404 with block 2 powered on to place the new entry in. In some implementations, the rows 404 do not have to have the same number of empty entries—if a row 404 has a number of empty entries within a threshold number or percentage of the smallest number of empty entries in a row 404, and that row 404 has a required block powered on, while no rows 404 with a smaller number of empty entries have the required block powered on, then the controller 401 chooses that row 404 with the required block powered on instead a row 404 that has a smaller number of empty entries. In some implementations, the controller 401 leaves one row 404 powered on for each possible combination of blocks 402 that can be powered on, or for a subset of the combinations of blocks 402 that can be powered on. In this implementation, for a new entry, the controller 401 selects the row 404 with the smallest number of entries that also has at least the required blocks 402 on, or for which the smallest number of blocks 402 need to be powered on. If there are no rows 404 with empty entries, the controller 401 powers a row 404 on. Similarly, if no rows 404 have blocks 402 powered on that are required for the entry, the controller 401 powers at least one block 402 on. At step 706, the controller 401 places the instruction state memory entry into the identified slot.

When all high-latency data comes in for an instruction in the instruction state memory 310, the instruction state memory 310 sends the instruction to functional units. In addition, if the instruction was the last instruction in a row 404, or the last instruction that uses a particular block 402 in a row 404, then the controller 401 powers down the row 404 or block 402. The power down may occur after a delay as described elsewhere herein. In addition, if, during the delay, a new instruction comes in that needs the row 404 or block 402, the power down does not occur. In addition, in some implementations, when the information for the instruction is sent to the functional units for execution, only the blocks 402 that are actually powered on for the instruction are read from, and thus no power is consumed for reading from un-powered blocks.

It should be understood that many variations are possible based on the disclosure herein. Although features and elements are described above in particular combinations, each feature or element can be used alone without the other features and elements or in various combinations with or without other features and elements.

The various functional units illustrated in the figures and/or described herein (including, but not limited to, the processor 102, the input driver 112, the input devices 108, the output driver 114, the output devices 110, the accelerated processing device 116, the scheduler 136, the graphics processing pipeline 134, the compute units 132, the SIMD units 138, the instruction dispatch unit 300, the instruction fetch unit 302, the decode unit 304, the low-latency data unit 306, the high-latency data unit 308, the instruction state memory 310, or the controller 401) may be implemented as a general purpose computer, a processor, or a processor core, or as a program, software, or firmware, stored in a non-transitory computer readable medium or in another medium, executable by a general purpose computer, a processor, or a processor core. The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method for processing computer instructions, the method comprising:
receiving, by an instruction dispatch unit of a processor, an instruction that specifies a core instruction state for the instruction, wherein the instruction references low latency data;
storing, by the instruction dispatch unit, the core instruction state into a first selectably-powered portion of an instruction state memory configured to store core instruction state and not low-latency data; and storing, by the instruction dispatch unit, the low latency data into a row that is already powered on and that includes at least one entry having a type that matches the low latency data, the row being of a second selectably-powered portion of the instruction state memory configured to store low latency data and not core instruction state for instructions.

2. The method of claim 1, further comprising:
upon receiving high-latency data for the instruction state memory, transmitting, by the instruction dispatch unit, data for the instruction in the instruction state memory and the high-latency data to one or more functional units for execution, wherein the high-latency data has a higher latency of access than low-latency data.

3. The method of claim 2, further comprising:
determining that, after transmitting the data in the instruction state memory to the one or more functional units for execution, a row from which the data is transmitted has no occupied slots; and
powering down the row.

4. The method of claim 3, wherein the powering down occurs after a waiting period.

5. The method of claim 1, further comprising identifying a slot in the instruction state memory for the core instruction state based on clustering criteria, by:
identifying a row in the instruction state memory that has a lowest, non-zero, number of empty slots, out of rows in the instruction state memory; and
identifying, as the slot for the core instruction state, an empty slot of the identified row.

6. The method of claim 1, wherein:
within the instruction state memory, a first powered-on row includes a first block for data of a first type, wherein the first block is powered on, and a second powered-on row includes a second block for data of the first type, wherein the second block is powered off; and
storing the core instruction state comprises identifying, as the first selectably-powered portion, a slot in the first powered-on row.

7. The method of claim 6, wherein the second powered-on row includes more empty slots than the first powered-on row.

8. The method of claim 1, further comprising identifying the first selectably-powered portion by:
determining that no powered-on rows have an empty slot; and
powering on a powered-off row,
wherein the first selectably-powered portion comprises the powered-off row that has been powered on.

9. An instruction state memory of a processor, comprising:
a plurality of selectably powered portions; and
a controller of the processor, the controller configured to:
receive an instruction that specifies a core instruction state for the instruction, wherein the instruction references low latency data;
store the core instruction state into a first selectably-powered portion of the plurality of selectably powered portions configured to store core instruction state for instructions and not low latency data; and
store the low latency data into a row that is already powered on and that includes at least one entry having a type that matches the low latency data, the row being of a second selectably-powered portion of the plurality of selectably powered portions configured to store low latency data and not core instruction state for instructions.

10. The instruction state memory of claim 9, wherein the controller is further configured to:
upon receiving high-latency data for the instruction state memory, transmit data for the instruction in the instruction state memory and the high-latency data to one or more functional units for execution, wherein the high-latency data has a higher latency of access than low-latency data.

11. The instruction state memory of claim 10, wherein the controller is further configured to:
determine that, after transmitting the data in the instruction state memory to the one or more functional units for execution, a row from which the data is transmitted has no occupied slots; and
power down the row.

12. The instruction state memory of claim 11, wherein the powering down occurs after a waiting period.

13. The instruction state memory of claim 9, wherein the controller is further configured to identifying a slot in the instruction state memory for the core instruction state based on clustering criteria, by:
identifying a row in the instruction state memory that has a lowest, non-zero, number of empty slots, out of rows in the instruction state memory; and
identifying, as the slot for the core instruction state, an empty slot of the identified row.

14. The instruction state memory of claim 9, wherein:
within the instruction state memory, a first powered-on row includes a first block for data of a first type, wherein the first block is powered on, and a second powered-on row includes a second block for data of the first type, wherein the second block is powered off; and
storing the core instruction state comprises identifying, as the first selectably-powered portion, slot in the first powered-on row.

15. The instruction state memory of claim 14, wherein the second powered-on row includes more empty slots than the first powered-on row.

16. The instruction state memory of claim 9, wherein the controller is further configured to identify the first selectably-powered portion by:
determining that no powered-on rows have an empty slot; and
powering on a powered-off row,
wherein the first selectably-powered portion comprises the powered-off row that has been powered on.

17. A processor, comprising:
an instruction state memory, comprising:
a plurality of selectably powered portions; and
a controller configured to:
receive an instruction that specifies a core instruction state identifying one or more micro-operations for the instruction, wherein the instruction references low latency data;
store the core instruction state into a first selectably-powered portion of the plurality of selectably powered portions configured to store core instruction state for instructions and not low latency data; and
store the low latency data into a row that is already powered on and that includes at least one entry having a type that matches the low latency data, the row being of a second selectably-powered portion of the plurality of selectably powered portions configured to store low latency data and not core instruction state for instructions.

18. The processor of claim 17, wherein the controller is further configured to:

upon receiving high-latency data for the instruction state memory, transmit data for the instruction in the instruction state memory and the high-latency data to one or more functional units for execution, wherein the high-latency data has a higher latency of access than low-latency.

19. The processor of claim 18, wherein the controller is further configured to:
    determine that, after transmitting the data in the instruction state memory to the one or more functional units for execution, a row from which the data is transmitted has no occupied slots; and
    power down the row.

20. The processor of claim 19, wherein the powering down occurs after a waiting period.

* * * * *